Figure 1:
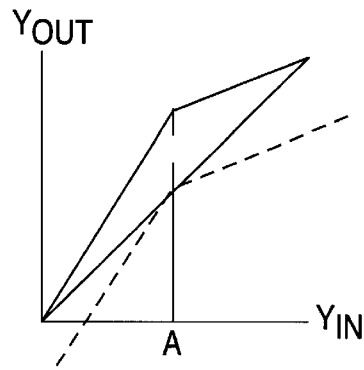

USO05812218A

United States Patent [19]
Elbert

[11] Patent Number: 5,812,218
[45] Date of Patent: Sep. 22, 1998

[54] DEVICE FOR THE GENERATION OF TRANSFER FUNCTIONS DEFINED BY INTERVALS

[75] Inventor: Mark Elbert, Frederick, Md.

[73] Assignee: Thomson multimedia S.A., Courbevoie, France

[21] Appl. No.: 549,153

[22] Filed: Oct. 27, 1995

[30] Foreign Application Priority Data

Nov. 7, 1994 [FR] France .................................. 94 13333

[51] Int. Cl.⁶ ........................................................ H04N 5/20
[52] U.S. Cl. ........................ 348/678; 348/687; 348/571
[58] Field of Search .................... 348/678, 674, 348/675, 676, 677, 679, 680, 681, 682, 683, 684, 685, 686, 687, 705, 571; H04N 5/20, 5/202, 5/208

[56] References Cited

U.S. PATENT DOCUMENTS

| | | | |
|---|---|---|---|
| 4,630,553 | 12/1986 | Kimura et al. .............................. | 330/2 |
| 4,884,141 | 11/1989 | Hyakutake ............................... | 348/685 |
| 5,396,288 | 3/1995 | Tsugita et al. ........................... | 348/229 |

FOREIGN PATENT DOCUMENTS

| | | |
|---|---|---|
| 478389 | 4/1992 | European Pat. Off. . |
| 63-15576 | 1/1988 | Japan .............................. H04N 5/208 |

OTHER PUBLICATIONS

Nachrichtentechnik Elektronik, 1981, East Germany vol. 31, No. 2, ISSN 0323–4657, pp. 77–81.
Kuhnel C "Principles of logarithmic amplifiers" p. 79, colonne de droite, dernier a linea — p. 80 colonne de gauche, alinea 2, figures 12, 13.

*Primary Examiner*—Chris Grant
*Attorney, Agent, or Firm*—Joseph S. Tripoli; Frederick A. Wein

[57] ABSTRACT

There is disclosed a device for the generation of transfer functions by segments. One of the device comprises at least two sets of amplifiers having different gains; a comparator for comparing an input signal with at least one reference signal and a switch which is controlled by the output from the comparator, for switching between the at least two sets of amplifiers depending on the status of the comparator output. Where the at least two sets of amplifiers having different gains, at least one gain is greater than 1, and at least one gain is less than 1.

18 Claims, 4 Drawing Sheets

DEVICE FOR THE GENERATION OF TRANSFER FUNCTIONS DEFINED BY INTERVALS

This invention concerns a device for the generation of transfer functions defined by intervals. In particular, the device according to the invention may be used to amplify or attenuate some parts of the luminances range of a video signal. The invention also concerns a receiver and/or display device including such a device.

In order to improve the visual comfort of a television viewer, a video signal may need to be amplified or attenuated differently at different luminances. For example, it may be desirable to amplify medium brightness ranges with respect to extreme ranges; greys will then become lighter. We may also wish to make dark ranges darker. This process is called "black stretch" or "white stretch".

The purpose of this invention is to put forward a device for the generation of transfer functions by segments, and which has the major advantage that it uses few circuit elements, and that its operating parameters may easily be adjusted. Furthermore, this device is very fast in operation.

The purpose of the invention is a device for the generation of transfer functions by segments, wherein it comprises at least two amplification means with different values of gain, means for making comparisons between the input signal and at least one reference signal, and a switch controlled by the output from the said means of comparison, the said switch switching between the said not less than two amplification means, depending on the status of the output of the comparison means.

Another purpose of the invention is a video signal reception or display device, wherein the luminances signal processing system comprises at least two amplification means with different values of gain, means for making comparisons between the input signal and at least one reference signal, and a switch controlled by the output from the said means of comparison, the said switch switching between the said not less than two amplification means, depending on the status of the output of the comparison means.

According to one specific embodiment, one of the amplification means is a gain cell known as a Gilbert gain cell.

According to another specific embodiment, one of the amplification means is an attenuation cell.

According to another specific embodiment, one of the amplification means is a cell with a gain of 1.

According to another specific embodiment, the device according to the invention includes a voltage/current converter.

In a first specific embodiment, the device comprises a differential pair of transistors, the base of the first transistor being connected to a first polarization voltage, the base of the second transistor receiving the signal to be amplified, the emitters of these transistors being connected through a resistance, and each emitter also being connected to a current source, the first transistor collector also being connected to the emitter of a third transistor, the collector of the second transistor being connected to the emitter of a fourth transistor, the bases of the third and fourth transistors being connected to a second polarization voltage, the device also comprising a fifth and sixth transistors with connected emitters, the device also comprising a seventh and eighth transistors with connected emitters, the bases of the fifth and seventh transistors being connected to the emitter of the fourth transistor, and the bases of the sixth and eighth transistors being connected to the third transistor, the collectors of the fourth, sixth and seventh transistors being connected to each other, and the collectors of the third, fifth and eighth transistors being connected to each other, to supply the circuit output currents, the emitters of the pair formed by the fifth and sixth transistors being connected to a first output of a switch, the emitters of the pair formed by the seventh and eighth transistors being connected to a second output of the said switch, the input of the said switch being connected to a current source, the switch being controlled by a comparator.

In a second embodiment, the device includes a differential pair of transistors, the base of the first transistor being connected to a first polarization voltage, the base of the second transistor receiving the signal to be amplified, the emitters of these transistors being connected through a resistance, each emitter also being connected to a current source, the collector of the first transistor being connected to the emitter of a third transistor, the collector of the second transistor being connected to the emitter of a fourth transistor, the bases of the third and fourth transistors being connected to a second polarization voltage, the device also comprising fifth and sixth transistors whose emitters are connected, the device also including a seventh and eighth transistors whose emitters are connected, the bases of the fourth and seventh transistors being connected to each other, and the bases of the third and eighth transistors being connected to each other, the bases of the fifth and sixth transistors being connected to the emitters of the fourth and third transistors respectively, the collectors of the fourth, sixth and seventh transistors being connected to each other, and the collectors of the third, fifth and eighth transistors being connected to each other, to supply the circuit output currents, the emitters of the pair formed by the fifth and sixth transistors being connected to a first output of a switch, the emitters of the pair formed by the seventh and eighth transistors being connected to a second output of the said switch, the input of the said switch being connected to a current source, the switch being controlled by a comparator.

In one specific embodiment, the said switch is degenerated.

In another specific embodiment, the said comparator compares the input signal with a reference value. The amplification change point is obtained when the circuit is in equilibrium, with the input signal and the reference value being equal. This avoids discontinuities at this point.

In another specific embodiment, at least one output current is converted to a voltage.

In another specific embodiment, the device according to the invention is used with a current-voltage converter comprising four transistors, the bases of the first and second transistors being connected to the said second reference voltage, the emitters of the first and second transistors being connected to the collectors of the third and fourth transistors respectively, and the emitters of the third and fourth transistors are each connected through a resistance to a current source, the base of the fourth transistor being connected to the said first reference voltage, the base of the third transistor outputting the said converter output voltage, the collectors of the first and second transistors carrying currents equal to the output currents.

Figure 3:
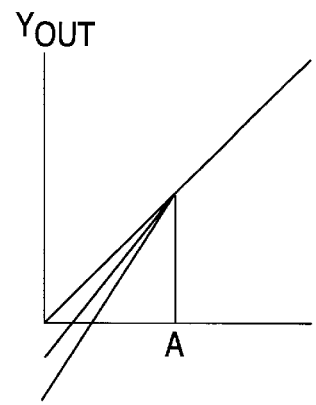
Figure 2:
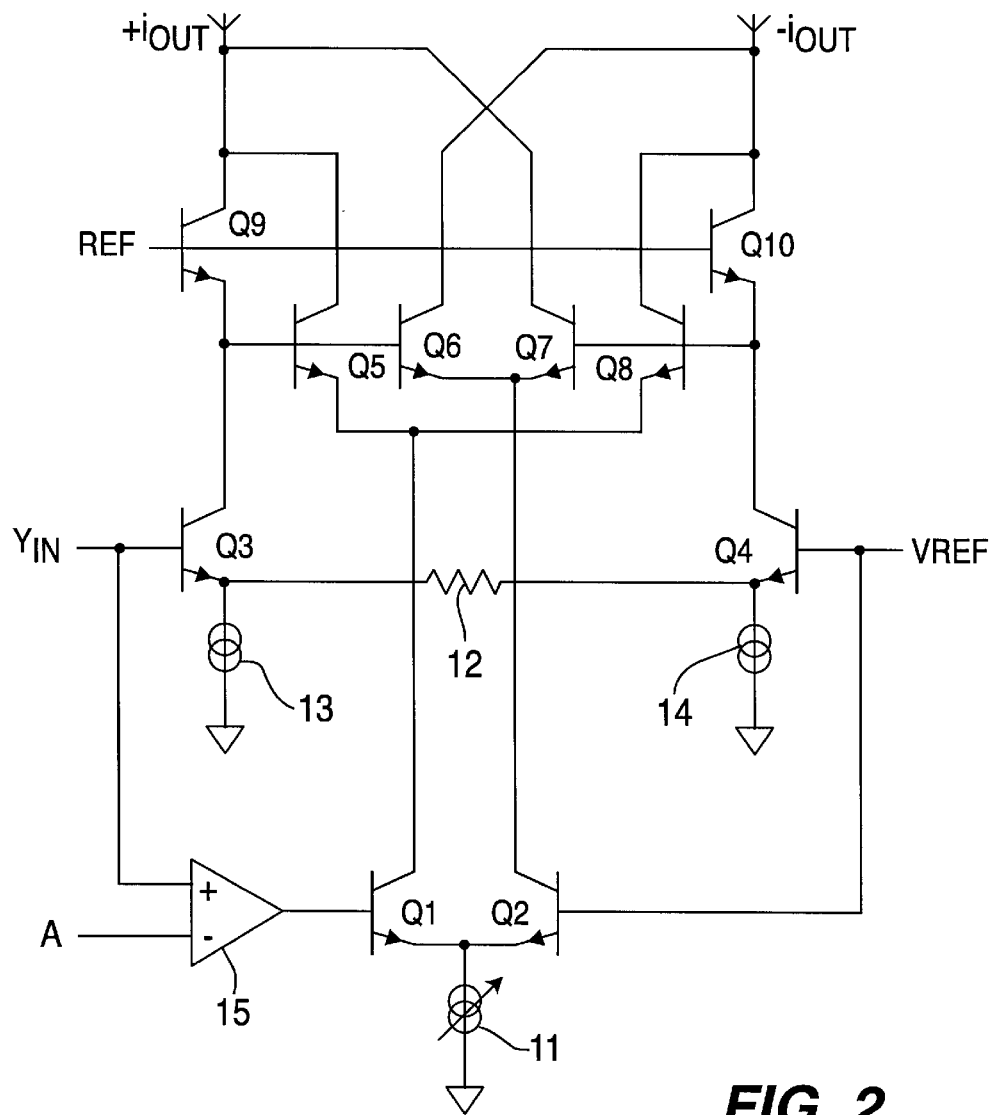
Figure 4:
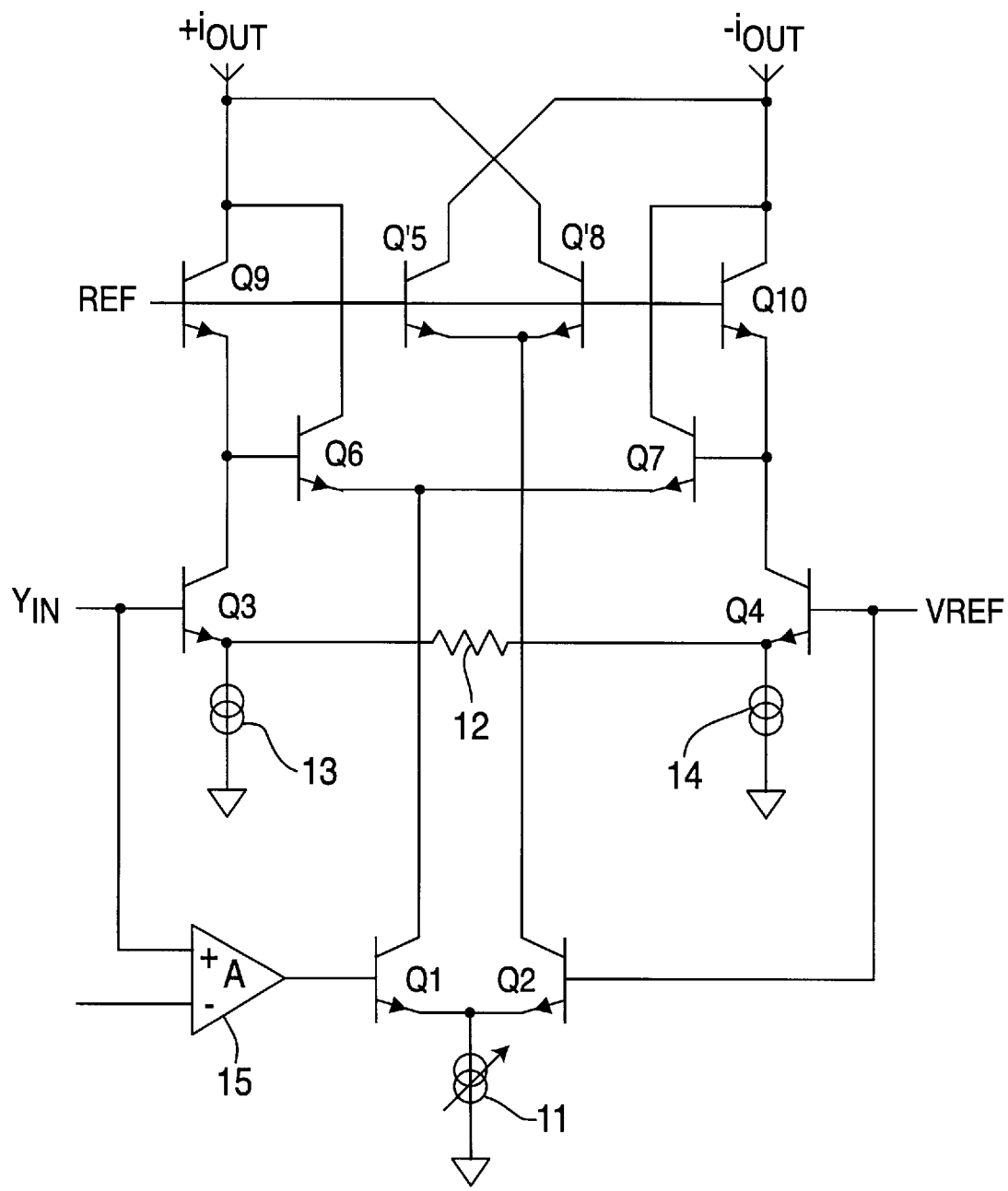
Figure 5:
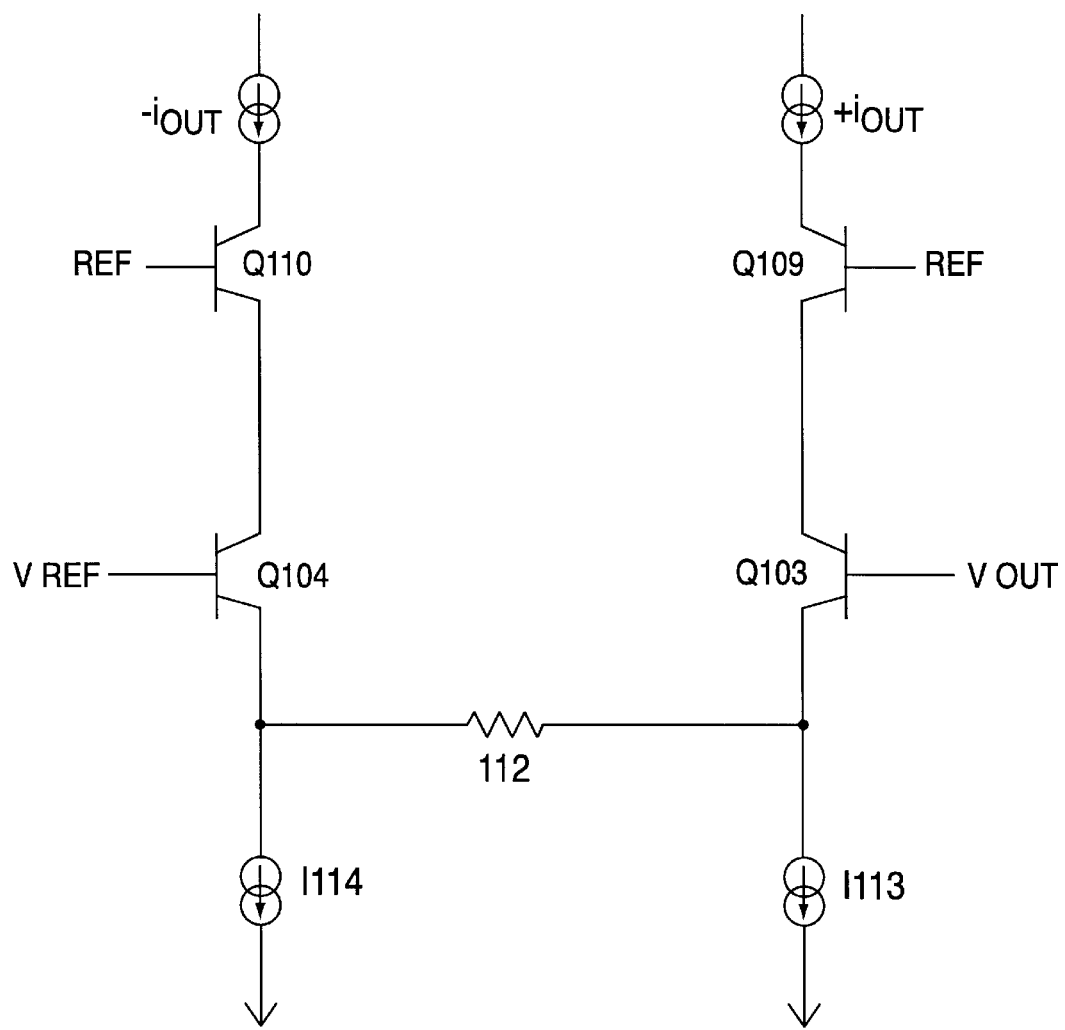
Figure 6:
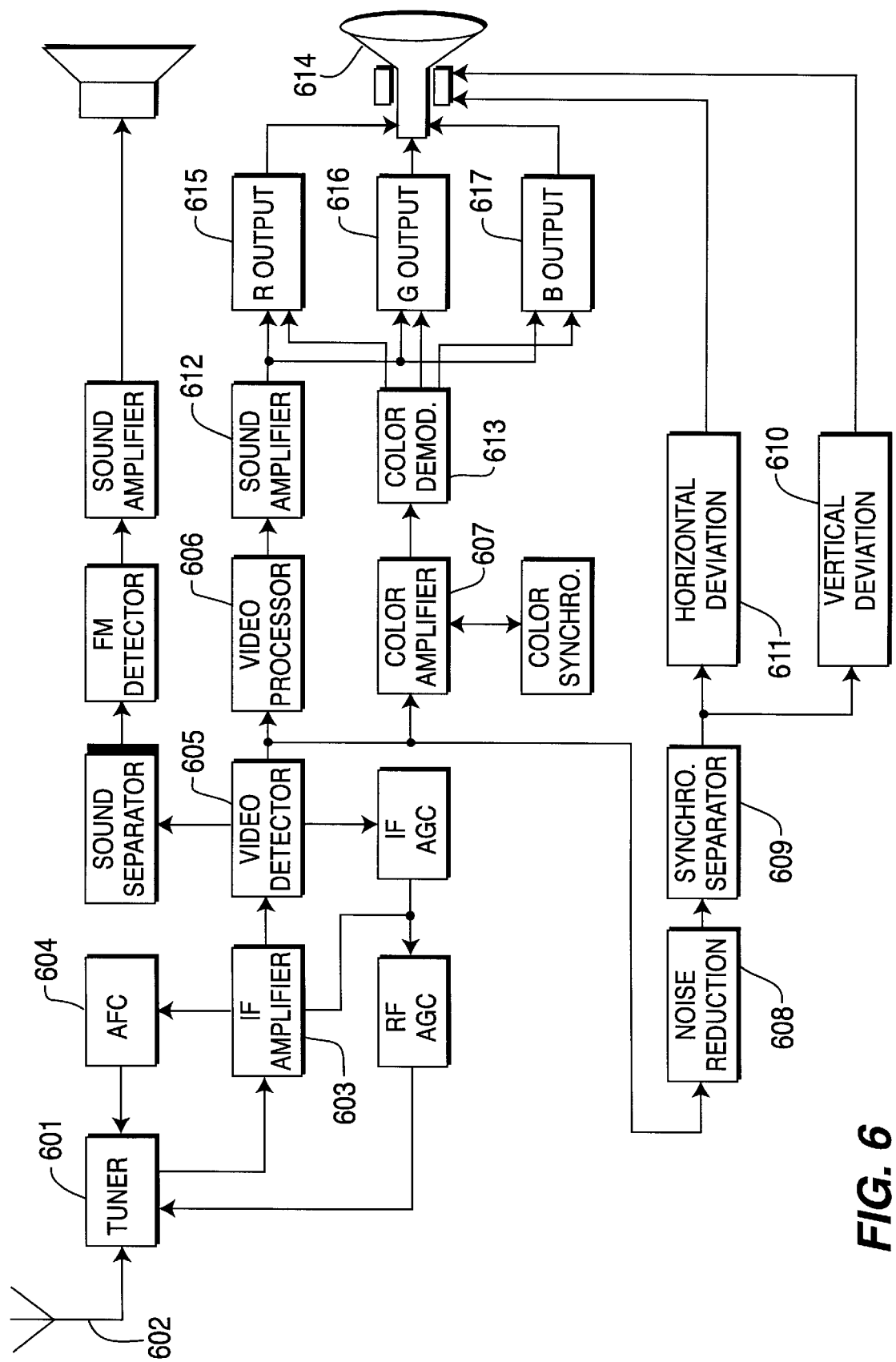

Other characteristics and advantages of the invention will become clear through the description of two non-restrictive embodiments of the invention illustrated by the attached figures in which:

FIG. 1 shows the circuit transfer function for the first example of an embodiment of the invention, FIG. 2 shows a circuit diagram for the first embodiment, FIG. 3 shows the circuit transfer function for the second example of an embodiment of the invention, FIG. 4 shows a circuit diagram for the second embodiment, FIG. 5 shows a circuit diagram of a current-voltage converter used according to a specific embodiment, in conjunction with the circuits in FIG. 2 or 4, FIG. 6 shows a block diagram of a television receiver.

The same elements have the same reference numbers on all these figures.

FIG. 1 shows a first example of a Yout=f(Yin) transfer function generated by a first circuit in accordance with the invention. In this example, a luminance signal Yin is amplified with gain α until a value of Yin equal to A, and above the value A is amplified with a gain β. The gain α is characterized by a transfer function in the form of a linear segment (shown as broken lines on the diagram) with a slope of greater than 1. The gain β is also characterized by a transfer function in the form of a linear segment, the slope of which is equal to b and is less than 1. The transfer function f is a continuous function: the two segments have a common point at abscissa A. The transfer function for the circuit in FIG. 2 (followed by a current-voltage converter, of which an embodiment is described later) is shown as a broken line on FIG. 1. The dc level of the circuit output signal will be adjusted until f(0)=0.

Therefore:

f (Yin)=α Yin if if $0 \leq Yin \leq A$ f (Yin)=βYin+A (α−β) if $A \leq Yin$

The dc component to be added is equal to (α−1)A.

In the following, A is called the break point. FIG. 2 illustrates a circuit used to obtain the transfer function f. The circuit includes a pair of NPN transistors Q1 and Q2, the emitters of which are connected to an adjustable current source 11.

The base of Q1 is connected to the output of a comparator 15 which compares the input voltage Yin and a voltage representing the break point.

The base of Q2 is connected to polarization voltage Vref.

Q1 and Q2 form a switch that makes a selection between currents output through two amplification cells, composed of the NPN transistors Q5, Q8 and Q6, Q7 respectively. To do this, the Q5 and Q8 emitters are connected to the Q1 collector, and the Q6 and Q7 emitters are connected to the Q2 collector.

The circuit also includes a differential pair of NPN transistors Q3 and Q4, in which Yin is input into the base of Q3, and the polarization voltage Vref is input into the base of Q4. The Q3 and Q4 emitters are connected through a resistance 12. The Q3 and Q4 emitters are also connected to current sources of the same value, 13 and 14, respectively. Transistors Q3, Q4 and resistance 12 form a voltage-current converter.

In the following, the current intensities output by the various current sources will be denoted in the form Ix, where x is the reference of the source considered.

The Q3 collector is connected to the emitter of an NPN transistor Q9, the collector of which is connected a current-voltage converter supplying the circuit output voltage Yout. This circuit is illustrated in FIG. 5 described later.

Similarly, the Q4 collector is connected to the emitter of an NPN transistor Q10, the collector of which is also connected to the current-voltage converter. The bases of Q9 and Q10 are connected to a REF polarization voltage.

The bases of the two transistors Q5 and Q6 are connected to the Q9 emitter, whereas the bases of Q7 and Q8 are connected to the Q10 emitter.

The Q5 collector is connected to the Q9 collector, and the Q8 collector is connected to the Q10 collector.

The Q6 collector is connected to the Q10 collector, and the Q7 collector is connected to the Q9 collector.

Transistors Q9, Q6, Q7 and Q10 form a cell with trans-linear amplification, also called Gilbert cell. This type of cell is described in "A New Wide-Band Amplifier Technique" IEEE JSSC, Vol SC3, No 4, December 1968.

The amplification of this cell is given approximately by the expression:

$$Ga = 1 + Go = 1 + \frac{I11}{2I13}$$

We therefore have an amplification that is a function of the variable current I11.

Transistors Q9, Q5, Q8 and Q10 form another cell. Note that, unlike the previous cell, the collectors of the central transistors Q5 and Q8 are not crossed. The resulting expression for the amplification is as follows:

$$Ga = 1 - Go = 1 - \frac{I11}{2I13}$$

The amplification is less than the amplification obtained previously.

According to an alternative embodiment of this first example, the switch formed by transistors Q1 and Q2 is degenerated to smooth the transition at the break point.

FIG. 3 shows a second example of a transfer function. Once again, the global transfer function denoted f2 is composed of two straight line segments and may be defined by:

f2 (Yin)=αYin−β if $0 \leq Yin \leq A$ f2 (Yin)=Yin if Yin>A

α is chosen>1.

FIG. 4 shows the corresponding circuit. The principle is similar to the principle of the first example. In this case, transistors Q5 and QB are placed differently and are denoted Q'5 and Q'8. The bases of these transistors are connected to the same polarization voltage REF as the bases of transistors Q9 and Q10.

For the cell formed by Q6, Q7, Q9 and Q10, the expression for the amplification is the same as it was before, whereas the amplification achieved by Q'5 and Q'8 is 1. The presence of the Q'5, Q'8 pair is to prevent sudden changes of the polarization current at the break point.

For the circuit in FIG. 2, there are current outputs at the collectors of Q9, Q5, Q7 and at the collectors of Q10, Q8, Q6. For the circuit in FIG. 4, there are current outputs at the collectors Q9, Q'5, Q7 and at the collectors of Q10, Q6, Q'8.

According to a preferred alternate embodiment, the circuit shown in FIG. 5 is used to convert the current output from the circuit in FIG. 2 into a voltage. The principle of this circuit is to duplicate some currents present in the circuit in an almost symmetrical structure. The principle is the same as for the circuit in FIG. 4.

Let Yout and −Yout be the currents passing through the output currents for the circuits in FIGS. 2 or 4.

The circuit in FIG. 5 includes four NPN transistors Q103, Q104, Q109, Q110, which correspond to transistors Q3, Q4, Q9, Q10 respectively. The Q109 emitter is connected to the Q103 collector, and the Q 110 emitter is connected to the Q104 collector. The Q103 emitter is connected to a current source 113, and the Q104 emitter is connected to current source 114. Obviously, I113=I114=I13=I14. The emitters of Q103 and Q104 are connected through a resistance 112 equal to resistance 12.

The base of Q104 is connected to Vref, and the bases of Q109 and Q110 are connected to the REF potential. A current mirror duplicates the current iout in the Q109 collector. A second current mirror duplicates the current −iout in the Q110 collector. The output voltage Vout is available on the base of Q103.

The symmetry of this circuit compared with the circuit in FIG. 2 has the advantage that it compensates for some circuit defects, particularly the influence of the base current in transistors Q9 and Q10.

In one specific embodiment, a matching stage with a known impedance is provided at the output from the circuit in FIG. 5.

FIG. 6 shows a block diagram of a television receiver. Tuner 601 of this receiver receives an RF signal through antenna 602. The intermediate frequency (IF) signal generated by tuner 601 is amplified by an IF amplifier 603, connected to an automatic frequency control circuit 604. The amplified IF signal is transmitted to a video detector 605. The resulting baseband signal is processed by a video processor 606 for the luminance, by a color amplifier 607 for the color, and by synchronization circuits (608 to 611) for horizontal and vertical synchronization. A video amplifier 612 amplifies the luminance signal Y output by the video processor 606, and a demodulation circuit 613 demodulates the color. Luminance and color signals thus generated are output in a known manner to a conversion matrix to give red, green and blue (RGB) signals controlling the cathode ray tube 614. This matrix is represented by blocks 615 to 617.

According to this embodiment example, the circuit in accordance with the invention is located in the luminance processing system, and more precisely in the video processor 606.

I claim:

1. Device for the generation of transfer functions by segments, wherein said device comprises at least two amplification means with different gains, at last one gain being greater than 1 and at least one gain being less than 1, means (15) for comparing an input signal (Yin) with at least one reference signal, and a switch (Q1, Q2) controlled by the output from said means for comparison, the switch switching between the at least two amplification means depending on the status of the output of the comparison means (15).

2. Device according to claim 1, wherein one of the amplification means is an amplification cell called a Gilbert gain cell.

3. Device according to claim 1 wherein one of the amplification means is an attenuation cell.

4. Device according to claim 1, further comprising a voltage-current converter (Q3, Q4, 12).

5. Device according to claim 4, said voltage-current converter including a first transistor Q4, a second transistor Q3, and a resistor 12, the base of the first transistor (Q4) being connected to a first polarization voltage (Vref), the base of the second transistor (Q3) receiving the signal (Yin) to be amplified, the emitters of these transistors being connected through the resistor (12), each emitter also being connected to a current source (13,14), the collector of the first transistor being connected to the emitter of a third transistor (Q10), the collector of the second transistor being connected to the emitter of a fourth transistor (Q9), the bases of the third and fourth transistors (Q10, Q9) being connected to a second polarization voltage (REF), the device also comprising a fifth (Q6) and sixth (Q7) transistors whose emitters are connected, the device also including a seventh and an eighth transistor (Q5, Q8) whose emitters are connected, the bases of the fifth and seventh transistors (Q6, Q5) being connected to the emitter of the fourth transistor (Q9), and the bases of the sixth and eighth transistors (Q7, Q8) being connected to the third transistor (Q10), the collectors of the fourth, sixth and seventh transistors (Q9, Q7, Q5) being connected to each other, and the collectors of the third, fifth and eighth transistors (Q10, Q6, Q8) being connected to each other, to supply the device output currents, the emitters of the pair formed by the fifth and sixth transistors (Q6, Q7) being connected to a first output of the switch (Q1, Q2), the emitters of the pair formed by the seventh and eighth transistors (Q5, Q8) being connected to a second output of the switch (Q1, Q2), the input of the switch being connected to a current source (111), the switch being controlled by the comparator (15).

6. Device according to claim 5, wherein at least one output current (iout, −iout) is converted to voltage.

7. Device according to claim 4, wherein said voltage-current converter including a differential pair of transistors, the base of the first transistor (Q4) being connected to a first polarization voltage (Vref), the base of the second transistor (Q3) receiving the signal to be amplified (Yin), the emitters of these transistors being connected through a resistance (12), and each emitter also being connected to a current source (13,14), the collector of the first transistor also being connected to the emitter of a third transistor (Q10), the collector of the second transistor being connected to the emitter of a fourth transistor (Q9), the bases of the third and fourth transistors (Q10, Q9) being connected to a second polarization voltage (REF), the device also comprising a fifth (Q6) and sixth (Q7) transistors with connected emitters, the device also comprising a seventh and eighth (Q5, Q8) transistors with connected emitters, the bases of the fourth and seventh transistors (Q9, Q5) being connected to each other, and the bases of the third and eighth transistors (Q10, Q8) being connected to each other, the bases of the fifth and sixth transistors (Q6, Q7) being connected to the emitters of the fourth and third transistors (Q9, Q10) respectively, the collectors of the fourth, sixth and seventh transistors (Q9, Q7, Q5) being connected to each other, and the collectors of the third, fifth and eighth transistors (Q10, Q6, Q8) being connected to each other, to supply the device output currents, the emitters of the pair formed by the fifth and sixth transistors (Q6, Q7) being connected to a first output of the switch (Q1, Q2), the emitters of the pair formed by the seventh and eighth transistors (Q5, Q8) being connected to a first output of a switch (Q1, Q2), the emitters of the pair formed by the seventh and eighth transistors (Q5, Q8) being connected to a second output of the switch (Q1, Q2), the input of the switch being connected to a current source (11), the switch being controlled by a comparator (15).

8. Device according to claim 7, further including a current-voltage converter comprising four transistors (Q109, Q110, Q103, Q104), the bases of a ninth and tenth transistors (Q109, Q110) being connected to a second reference voltage (REF), the emitters of the ninth and tenth transistors (Q109, Q110) being connected to the collectors of an eleventh and twelfth transistors (Q103, Q104) respectively, the emitters of the eleventh and twelfth transistors being connected to current source (113, 114) and to each other through a resistance, the base of the eleventh transistor being connected to a first reference voltage (Vref), the base of the twelfth transistor (Q103) outputting the voltage from the converter output, the collectors in the nineth and tenth transistors carrying currents equal to output currents (iout, −iout).

9. Device according to claim 7, wherein at least one output current (iout, −iout) is converted to voltage.

10. Device according to claim 6, further including a current-voltage converter comprising four transistors (Q109, Q110, Q103, Q104), the bases of a first and second transistors (Q109, Q110) being connected to second reference voltage (REF), the emitters of the first and second transistors (Q109, Q110) being connected to the collectors of a fourth and third transistors (Q103, Q104) respectively, the emitters of the fourth and third transistors being connected to current source (113, 114) and to each other through a resistance, the base of the fourth transistor being connected to a first reference voltage (Vref), the base of the third transistor (Q103) outputting the voltage from the converter output, the collectors in the first and second transistors carrying currents equal to output currents (iout, −iout).

11. Device according to claim 1, wherein the switch is degenerated.

12. Device according to claim 1, wherein the means for comparison (15) compare the input signal (Yin) with a single reference value (A).

13. In a video signal reception or display device, a luminance signal processing system comprising at least two amplification means with different gains, at least one gain being greater than 1, means (15) for comparing an input signal (Yin) with at least one reference signal, and a switch (Q1, Q2) controlled by the output from said means for comparison, the switch switching between the at least two amplification means depending on the status of the output of the comparison means (15).

14. Device according to claim 13, wherein one of the amplification means is an amplification cell with a gain of 1.

15. Device according to claim 13, wherein one of the amplification means is an amplification cell called a Gilbert gain cell.

16. Device according to claim 13, further comprising a voltage-current converter (Q3, Q4, 12).

17. Device according to claim 13, wherein the switch is degenerated.

18. Device according to claim 13, wherein said means for comparison (15) compares the input signal (Yin) with a single reference value (A).

* * * * *